United States Patent [19]

Shimakura et al.

[11] Patent Number: 5,137,847
[45] Date of Patent: Aug. 11, 1992

[54] METHOD OF PRODUCING GAAS SINGLE CRYSTAL SUBSTRATE USING THREE STAGE ANNEALING AND INTERSTAGE ETCHING

[75] Inventors: Haruhito Shimakura; Manabu Kanou, both of Toda, Japan

[73] Assignee: Nippon Mining Co., Ltd., Japan

[21] Appl. No.: 805,933

[22] Filed: Dec. 12, 1991

[30] Foreign Application Priority Data

Dec. 14, 1990 [JP] Japan .................. 2-410669

[51] Int. Cl.$^5$ ........................... H01L 21/324
[52] U.S. Cl. .................... 437/248; 437/225; 437/946; 437/974; 148/DIG. 3; 148/DIG. 51; 148/DIG. 56; 148/DIG. 65
[58] Field of Search .............. 148/DIG. 3, DIG. 51, 148/DIG. 56, DIG. 65; 437/225, 248, 446, 974

[56] References Cited

U.S. PATENT DOCUMENTS

| | | | |
|---|---|---|---|
| 4,547,256 | 10/1985 | Girtler et al. | 437/248 |
| 4,889,493 | 12/1989 | Otsuke et al. | 437/248 |
| 5,047,370 | 9/1991 | Yamamoto et al. | 437/248 |

FOREIGN PATENT DOCUMENTS

| | | | |
|---|---|---|---|
| 1102932 | 4/1989 | Japan | 437/248 |
| 1104751 | 4/1989 | Japan | 437/248 |
| 1235333 | 9/1989 | Japan | 437/248 |
| 2137524 | 10/1984 | United Kingdom | 437/248 |
| 8908158 | 9/1989 | World Int. Prop. O. | 437/248 |

*Primary Examiner*—Olik Chaudhuri
*Assistant Examiner*—G. Fourson
*Attorney, Agent, or Firm*—Birch, Stewart, Kolasch & Birch

[57] ABSTRACT

A method of producing a GaAs single crystal substrate comprises the steps of conducting a first-stage annealing by vacuum-sealing a GaAs single crystal wafer and arsenic in a heat-resistant vessel and heating the wafer to a temperature of 1050° to 1150° C. while exposing it to arsenic vapor pressure, cooling the wafer to room temperature at a cooling rate of 1°–25° C./min., removing the wafer from the vessel, etching the wafer and placing it in another vessel, conducting a second-stage annealing by heating the wafer to a temperature of 910° to 1050° C. in a non-oxidizing atmosphere, cooling the wafer to room temperature at a cooling rate of 1°–25° C./min., removing it from the vessel, etching the wafer, conducting a third-stage annealing by vacuum-sealing the wafer and arsenic in the heat-resistant vessel and heating the wafer to a temperature of 520°–730° C. while exposing it to arsenic vapor, and cooling the wafer at least down to 400° C. at a cooling rate of 15°–30° C./min.

1 Claim, 9 Drawing Sheets

Cooling rate (°C/min)

METHOD OF PRODUCING GAAS SINGLE CRYSTAL SUBSTRATE USING THREE STAGE ANNEALING AND INTERSTAGE ETCHING

BACKGROUND OF THE INVENTION

1. Field of the Invention

This invention relates to a method of producing a GaAs single crystal substrate, more particularly to a heat treatment method used after growth of the single crystal. The technology provided by the invention can be effectively used in a method of producing a GaAs substrate that provides a substrate which is highly suitable for an electronic device such as an FET.

2. Description of the Related Art

GaAs, a compound semiconductor, is industrially produced mainly by methods such as the liquid encapsulated Czochralski method (LEC method) and the horizontal Bridgman method. Since these single crystal growth methods grow the single crystal in a crystal growth furnace having a temperature gradient, the temperature environment of the growing crystal is different at different parts thereof. This results in a grown crystal with uneven internal characteristics. When such a crystal is sliced into wafers as it is and the wafers are used as the substrate for electronic devices, the internal unevenness of the crystal shows up in the form of dispersion among the characteristics of the individual devices and leads directly to reduced device yield. In the fabrication of such high-speed devices as discrete FETs (field-effect transistors) and integrated circuits on a GaAs wafer, for example, characteristic irregularities in the wafer surface lead to differences among the threshold voltages of the individual FETs or the FETs on one and the same chip, making it impossible to obtain products with identical characteristics. For eliminating internal crystal unevenness, Rumsby et al. proposed a method for annealing the single crystal ingot at a high temperature following its growth (D. Rumsby, R. M. Ware, B. Smith, M. Tyjerg, and M. R. Brozel; IC Symposium, Phoenix, Technical Digest (1983) 34). This proposal was followed by the development of various other ingot annealing methods as taught, for example, by Japanese Patent Public Disclosures Sho 61-201700, Sho 61-222999, Sho 62-21699, Sho 62-162700 and Sho 2-21800.

The method of Rumsby is, however, not able to reduce the dispersion in FET threshold voltage to an adequate degree.

While the various methods proposed in the patent applications filed after the announcement of the Rumsby method have auxiliary effects such as increasing the efficiency of the annealing operation or are able to increase the resistivity of low resistivity crystals, they are not capable of reducing the dispersion in threshold voltage within the wafer to a satisfactory degree.

Earlier research by the inventors shows that two highly effective methods for evaluating the uniformity of GaAs wafers are (1) to observe the cathode luminescence of the wafer surface and (2) to measure the density of the small flaws (egg-shaped pits) that appear when the wafer is etched with AB etchant (2ml $H_2O$, 8mg $AgNO_3$, 1 g $CrO_3$, 1 ml HF). For capturing the cathode luminescence image, it is preferable to use a scanning electron microscope modified by the installation of a reflecting mirror and a light detector since this facilitates the measurement and also, by enabling the luminescence image to be obtained with a resolution of 0.5-1 $\mu$m, makes it possible to better examine the microscopic uniformity of the wafer surface.

The inventors examined the luminescence images of the surfaces of GaAs single crystals which had been subjected to conventional heat treatment. Irregular light emission distribution was observed irrespective of the method used. This irregularity of the cathode luminescence image suggests uneven distribution within the crystal of characteristic defects such as impurities and EL2, and indicates that the required degree of uniformity has not yet been achieved.

The inventors next used method (2) to examine crystals grown by the LEC method. After fabricating FETs and evaluating their characteristics, they removed the FET electrodes by etching with AB etchant. For each of the FETs, they then investigated the correlation between the FET characteristics and the egg-shaped pits that appeared. As a result, they discovered that the FET characteristics are severely degraded when egg-shaped pits appear at the gate region of the device. (See, for example, Yamamoto et al.: "Microscopic defects in semi-insulating GaAs and their effects on the FET device characteristics" (International Conference on the Science and Technology of defect control in semiconductors, Yokohama (1989.8)) and Yamamoto et al.: "Microscopic defects in semi-insulating GaAs and their effects (Journal of Electrochemical Science, Volume 136 (1989) P.3098)). Using the same method, they next measured the egg-shaped pit density of GaAs wafers which had been subjected to the aforementioned conventional heat treatment. The density was observed to be high ($> 10^4 cm^{-2}$) in all cases and it was found that FETs fabricated on the wafers exhibited a wide range of threshold voltages.

Another effective way for evaluating uniformity is to measure the microscopic resistivity distribution in the wafer surface and still another is to observe the wafer surface profile after etching with AB etchant. In particular, it is known that there is a one-to-one correlation between FET threshold voltage dispersion and microscopic resistivity distribution and that the dispersion in threshold voltage decreases in proportion as the dispersion in resistivity decreases (Asai et al., Shingaku Giho, CPM87-55.1 (1987). Moreover, since etching with AB etchant proceeds through an electrochemical reaction between the etching liquid and the wafer, the etching rate depends on the Fermi level of the GaAs substrate and, therefore, if differences arise in the Fermi level between different points on the wafer surface, irregularities will be produced owing to differences in etching rate.

Taking the foregoing into consideration, the inventors concluded that there are five conditions which determine whether a GaAs single crystal substrate exhibits uniform characteristics making it optimum for use as the substrate of electronic devices:

(a) Uniform cathode luminescence.
(b) Low density of the minute defects (egg-shaped pits) which appear when the wafer is AB-etched.
(c) Small dispersion in the microscopic resistivity distribution.
(d) Flat wafer surface profile after AB etching.
(e) Dislocation density not larger than that of the as-grown crystal.

The inventors further concluded that all of these conditions can be met by developing an appropriate annealing method.

Actually, a number of annealing methods more complex than the conventional ingot annealing method have recently been proposed. However, none of them is able to produce a crystal which satisfies all of the requirements (a) to (e). In one such method set out in Japanese Patent Application Sho 63-042508 the density of the egg-shaped pits that appear with AB etching is reduced by cooling the ingot after it has been annealed at a temperature exceeding 1100° C. While this method does indeed reduce the minute defect density and, moreover, results in an EDP (etch pit density, an index of the dislocation density) of the same level as that of the as-grown crystal, it does not achieve a uniform cathode luminescence image. Another method proposed in Japanese Patent Public Disclosure Sho 62-226900 realizes uniform microscopic resistivity distribution by gradual annealing the ingot at high, low and medium temperatures. However, this method has drawbacks in that the cathode luminescence image is irregular, the egg-shaped pit density is greater than $10^5 cm^{-2}$, a value as high as that of the as-grown crystal, and the EDP is higher than that of the as-grown crystal. In addition, Look et al. have proposed an annealing method in which GaAs crystal is first annealed at a high temperature to once convert it to P type for reduction of EL2 defects and is then annealed at a medium temperature (D. C. Look, P. W. Yu, M. W. Theis, W. Ford, G. Mathur, J. R. Sizelore, D. H. Lee, and S. S. Li; Appl. Phys. Lett. 49, 1083 (1986)). However, this method fails to satisfy any of the conditions (a) to (e).

As can be seen from the foregoing, the earlier methods are able to satisfy only 1 or 2 of the conditions (a) to (e) at most and none is able to satisfy all five conditions.

The inventors therefore developed a two-stage wafer annealing method capable of producing a crystal satisfying all of (a)–(e) (Japanese Patent Application Hei 1-199202). While this was the first annealing method meeting all of conditions (a)–(e), further tests revealed that it left room for improvement in respect of condition (c) relating to microscopic resistivity distribution and condition (d) relating to flatness of the wafer surface profile after AB etching.

SUMMARY OF THE INVENTION

An object of the invention is to provide an annealing method capable of producing a GaAs single crystal substrate that is an improvement on the two-stage wafer annealing method developed earlier by the inventors and is capable of producing a GaAs single crystal substrate which, satisfying all of the five conditions (a)–(e), is an optimum substrate for electronic devices.

The invention achieves this object by providing a method of producing a GaAs single crystal substrate comprising the steps of conducting a first-stage annealing by vacuum-sealing a GaAs single crystal wafer and arsenic in a heat-resistant vessel and heating the wafer to a temperature of 1050° to 1150° C. while exposing it to arsenic vapor pressure, cooling the wafer to room temperature at a cooling rate of 1°-25° C./min., removing the wafer from the vessel, etching the wafer and placing it in another vessel, conducting a second-stage annealing by heating the wafer to a temperature of 910° to 1050° C. in a non-oxidizing atmosphere, cooling the wafer to room temperature at a cooling rate of 1°-25° C./min., removing it from the vessel, etching the wafer, conducting a third-stage annealing by vacuum-sealing the wafer and arsenic in the heat-resistant vessel and heating the wafer to a temperature of 520°-730° C. while exposing it to arsenic vapor, and cooling the wafer at least down to 400° C. at a cooling rate of 15°-30° C./min.

DESCRIPTION OF THE INVENTION

Although the minute defects (egg-shaped pits) which are brought out by AB etching and degrade FET characteristics have been presumed to be As precipitates, their true nature has not been clarified. It seems most likely, however, that they are some kind of precipitated or segregated impurity.

For reducing the density of these egg-shaped pits, the inventors conducted ingot annealing at a temperature just below the melting point. As this was found to produce a dramatic reduction in the egg-shaped pit density, the inventors filed for patent on this technology under Japanese Patent Application Sho 63-42508. However, this method was found to result in a nonuniform cathode luminescence image and insufficient uniformity of the planar resistivity. Next, the inventors placed a wafer (not an ingot) in a vacuumized ampoule and annealed it at a temperature between 1000° C. and the melting point. When the wafer was examined after being cooled to room temperature, it was found that the reduction in the egg-shaped pit density was even greater than in the case of high-temperature ingot annealing. This is clearly shown in FIG. 1. In this figure, reference symbol A indicates the egg-shaped pit density measured for the as-grown crystal, B that for a crystal subjected to 1100° C. ingot annealing, and C that for a crystal subjected to 1100° C. wafer annealing. It will be understood that in the high-temperature wafer annealing the ranges of the temperature, time, As vapor pressure and post-annealing cooling rate conditions which give optimum results in terms of both egg-shaped pit reduction and electrical characteristics can be determined by experiment. For example, FIG. 2 shows the relationship between high-temperature annealing temperature and resistivity, FIG. 3 that between high-temperature annealing time and resistivity, FIG. 4 that between the As vapor pressure (in terms of $As_4$) applied inside the ampoule during high-temperature annealing and resistivity, and FIG. 5 that between post-annealing cooling rate and resistivity. From these graphs it will be understood that the annealing conditions for avoiding excessively low resistivity ($<10^7 \Omega \cdot cm$) are an annealing temperature of 900°–115020 C., an annealing time of not more than 11 hr, an As vapor pressure of not less than 0.6 atm., and a post-annealing cooling rate of not more than 25° C./min.

Figure 6:
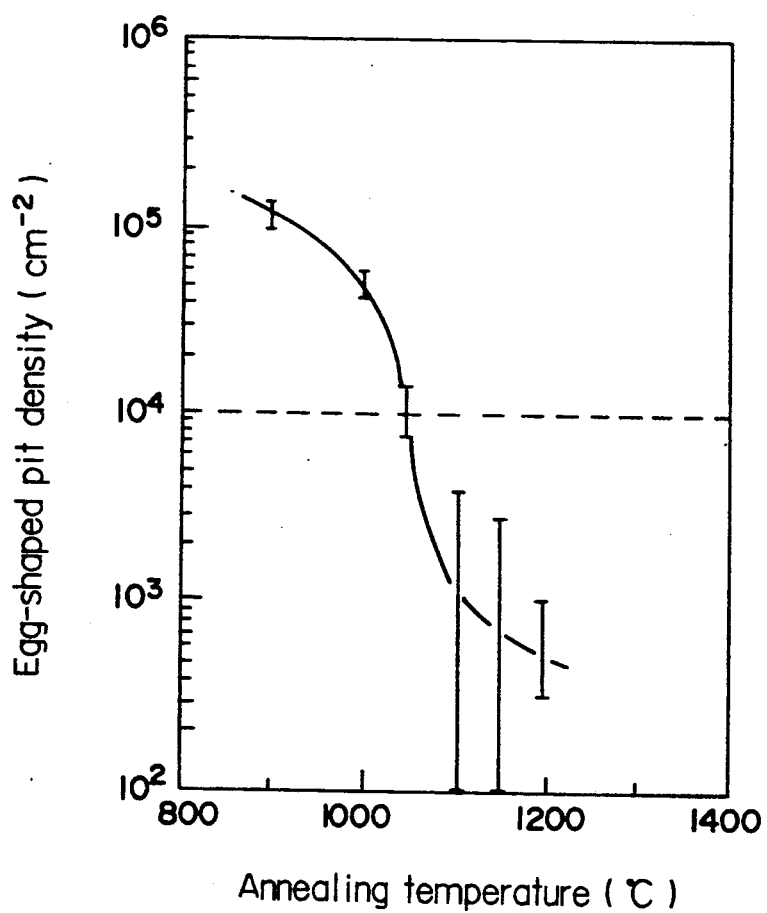
FIG. 6 is a graph showing the correlation between annealing temperature and egg-shaped pit density in a wafer subjected to conventional high-temperature wafer annealing.

FIG. 6 shows the relationship between high-temperature annealing temperature and density of the egg-shaped pits that appear after AB etching. From this it will be understood that the annealing temperature has to be not less than 1050° C. for obtaining an egg-shaped pit density of not more than $10^4 cm^{-2}$.

Figure 8:
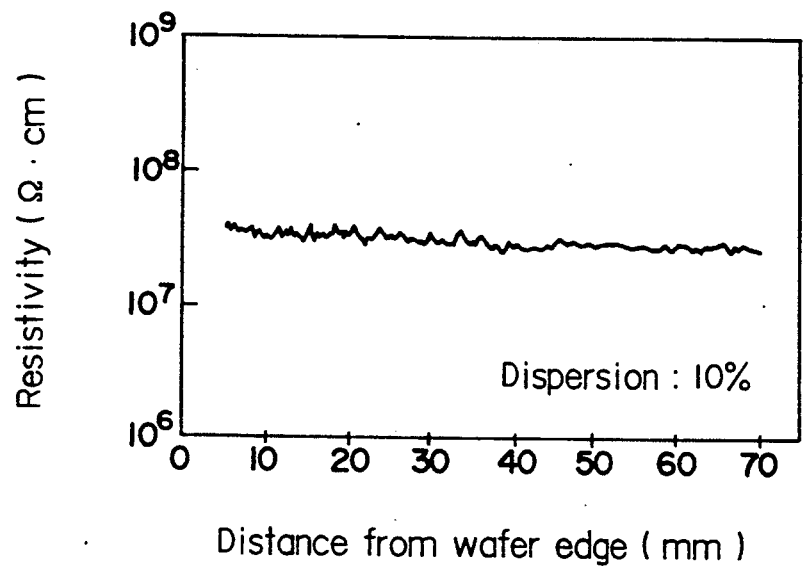
FIG. 8 is a graph showing the post-annealing planar resistivity distribution in a wafer subjected to conventional two-stage wafer annealing.
Figure 9:
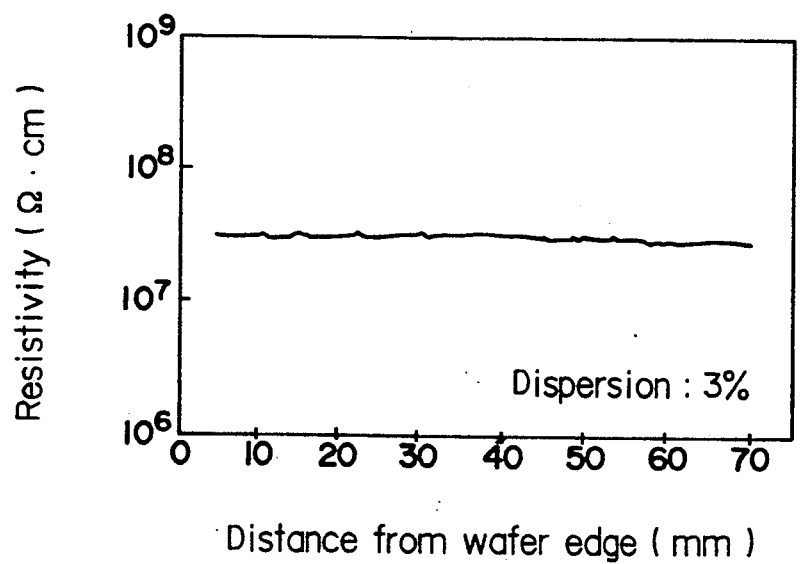
FIG. 9 is a graph showing the post-annealing planar resistivity distribution in a wafer subjected to conventional three-stage wafer annealing.
Figure 10:
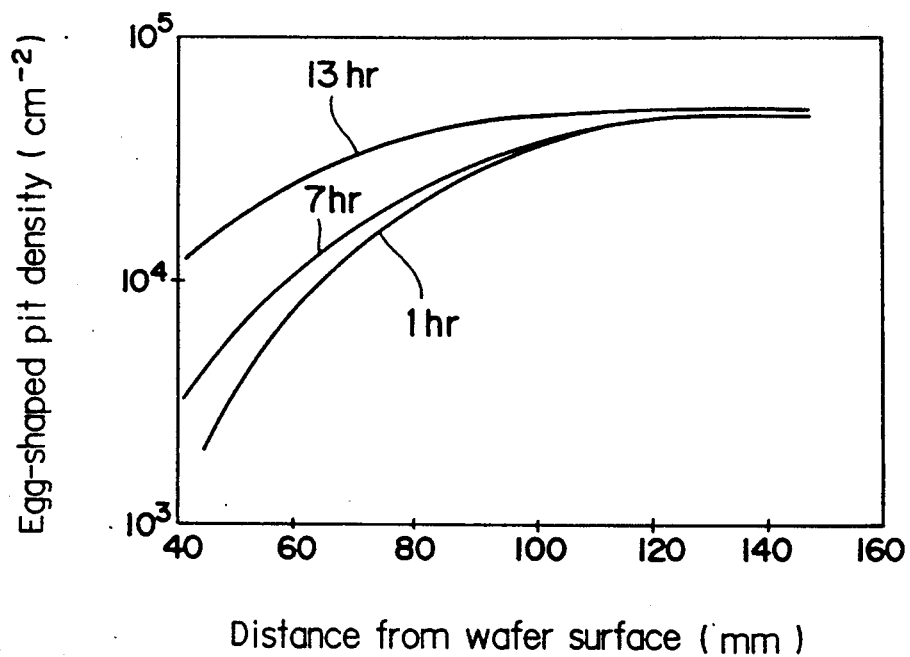
FIG. 10 is a graph showing the egg-shaped pit density distribution in the thickness direction of wafers subjected two-stage annealing using different second-stage annealing times.

The problem is, however, that the cathode luminescence image and planar resistivity distribution of the high-temperature annealed wafer are rather poor in uniformity notwithstanding the reduction in egg-shaped pit density. The inventors therefore tried an annealing method in which the wafer once high-temperature annealed at 1100° C. was removed from the ampoule, etched to a depth of at least 1 μm using an OH etchant (25 g NaOH, 100 cc $H_2O_2$ and 2000 cc $H_2O$) for removal of As adhering to the surface and of impurities and the like that had dispersed from the interior to the surface, and then subjected to second-stage annealing at a medium range temperature of around 950° C. This procedure was found to result in a cathode luminescence image with a uniform light emission distribution and also, as shown in FIG. 8, in a planar resistivity distribution that was markedly more uniform than that in the case of high-temperature wafer annealing. Nonetheless, the second-stage annealing was found to entail a major problem. The medium temperature annealing caused the egg-shaped pit density once reduced by the high-temperature annealing to rise again, with the density becoming greater with increasing distance inward from the wafer surface. That is to say, the egg-shaped pit density assumed a gradient in the wafer depth direction. Moreover, the depth direction profile was found to be related to the annealing time, as shown in FIG. 10. In other words, the egg-shaped pit density was reduced from the $(0.5-5) \times 10^5 cm^2$ of the as-grown crystal to $(0.1-3) \times 10^3 cm^{-2}$ by the high-temperature annealing but was then increased again by the medium temperature annealing in such manner as to approach more nearly to the level of the as-grown crystal with increasing depth from the wafer surface. From this, it was concluded that an annealing time of not more than 10 hr is preferable.

Figure 11:
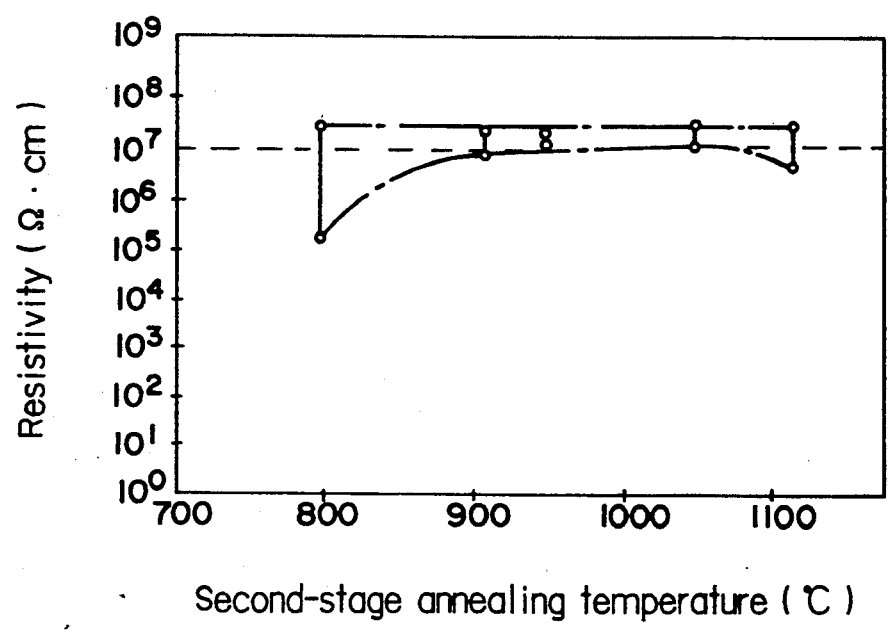
FIG. 11 is a graph showing the relationship between second-stage annealing temperature and the range over which resistivity varies in a wafer subjected to two-stage annealing.

FIG. 11 shows the relationship between second-stage annealing temperature and dispersion in planar resistivity distribution. It will be noted that the temperature range within which the planar dispersion stays within 10% is 910°–1050° C. Although the second-stage annealing was conducted in a vacuumized ampoule under application of As vapor pressure, the cathode luminescence image was less than completely uniform. As the atmosphere for the second-stage annealing it is preferable to employ a non-oxidizing atmosphere such as $N_2$ or Ar. Notwithstanding the foregoing results, the threshold voltages of FETs fabricated on the second-stage annealed wafer were found to be dispersed widely between 8-15 mV.

Figure 12:
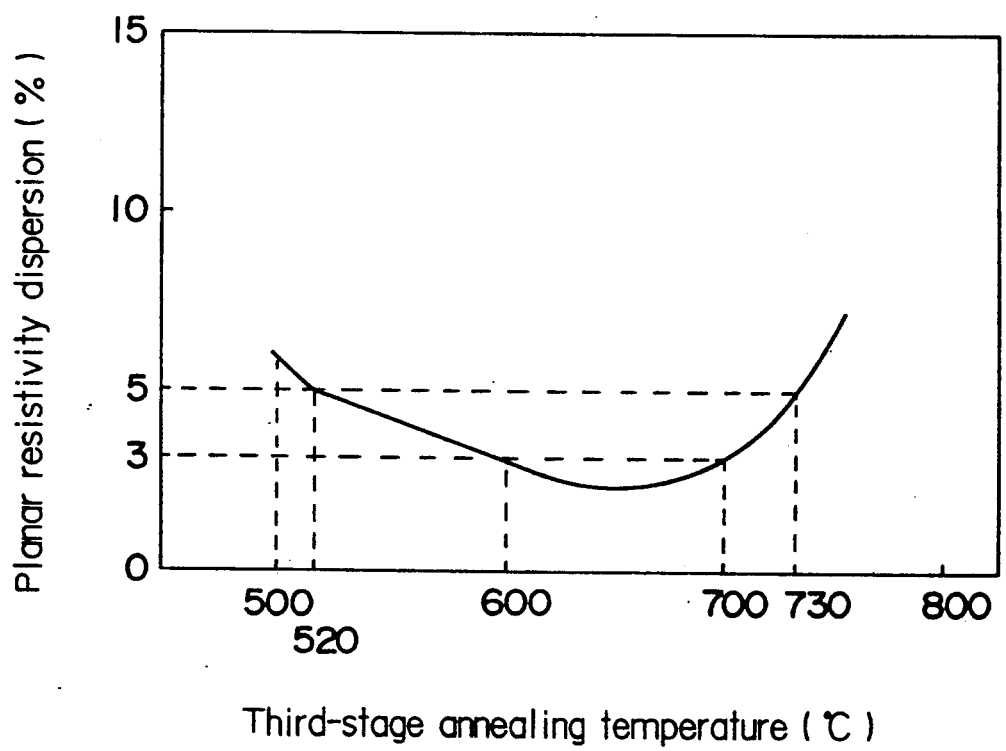
FIG. 12 is a graph showing the relationship between third-stage annealing temperature and planar resistivity dispersion in a wafer subjected to three-stage annealing according to the invention.

The inventors therefore tried a third-stage annealing in which the wafer subjected to second-stage annealing was returned to the vacuumized ampoule and annealed at a medium range temperature under application of As vapor pressure. FIG. 12 shows how the dispersion in planar resistivity changed when the third-stage annealing temperature according to this annealing method was varied between 500° and 750° C. It will be noted that it is possible to achieve a planar resistivity dispersion of 5% or less by setting the third-stage annealing temperature between 520° and 730° C. and to reduce it even further to 3% or less by using a temperature between 600° and 700° C. In either case, the dispersion is substantially lower than that following second-state annealing.

Figure 13:
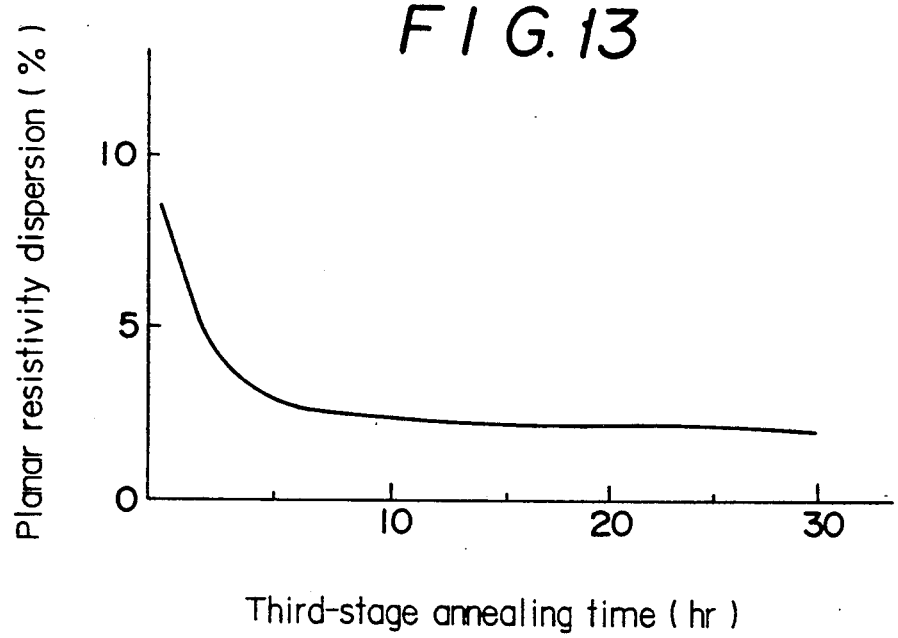
FIG. 13 is a graph showing the relationship between third-stage annealing time and planar resistivity dispersion in a wafer subjected to three-stage annealing according to the invention.
Figure 14:
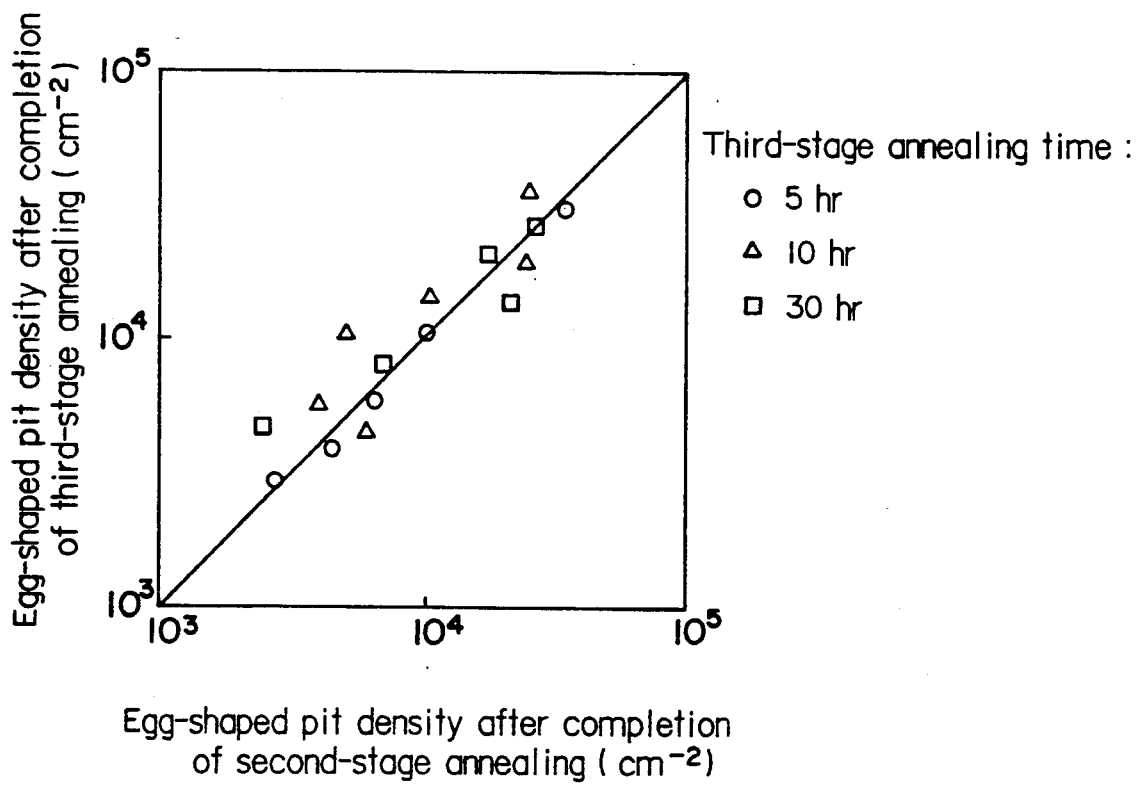
FIG. 14 is a graph showing the relationship between the egg-shaped pit density at the completion of second-stage annealing and those at the completion of third-stage annealing in a wafers subjected to three-stage annealing according to the invention.

FIG. 13 shows the relationship between third-stage annealing time and dispersion in planar resistivity. It will be noted that a third-stage annealing time of not less than 5 hr is preferable. There was almost no As precipitation or As-related impurity precipitation in the second annealing and, as shown in FIG. 14, the egg-shaped pit density was at about the same level as that following completion of the second-stage annealing.

Figure 15:
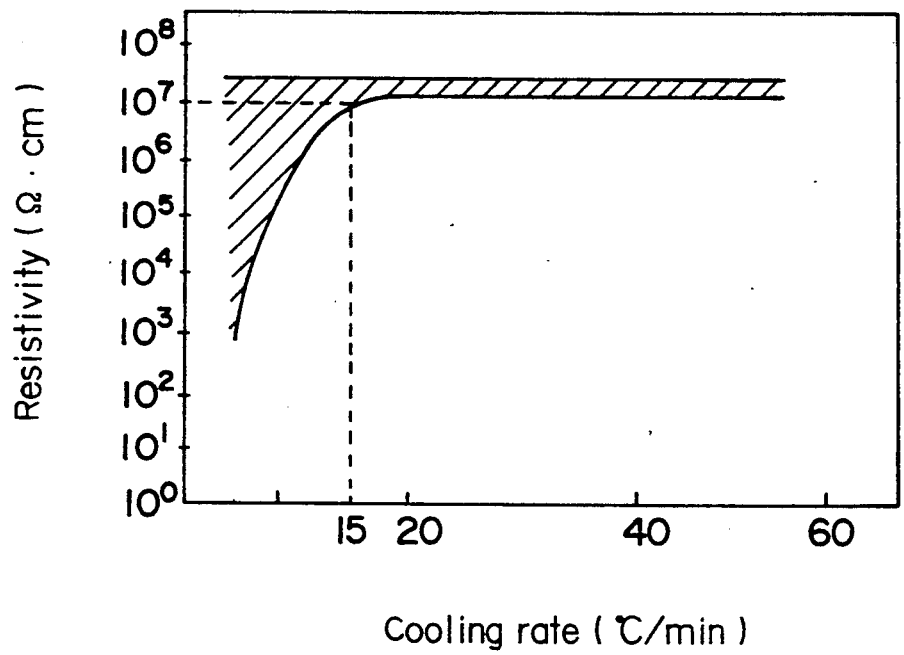
FIG. 15 is a graph showing the relationship between cooling rate following third-stage annealing and the range over which resistivity varies in a wafer subjected to three-stage annealing according to the invention.

FIG. 15 shows the correlation between the cooling rate following third-stage annealing and the resistivity. This graph shows that a low resistivity phenomenon occurs locally in the wafer surface when the cooling rate is slow, giving rise to large resistivity dispersion. On the other hand, when the cooling rate is too fast, i.e. when it exceeds 30° C./min., sliplines occur in the wafer owing to thermal strain. From this it can be concluded that the optimum cooling rate for obtaining a high-quality wafer that exhibits a resistivity of hot less than $10^7 \Omega$·cm and is free of sliplines is 15°–30° C./min.

By optimizing the three-stage wafer annealing conditions in the foregoing manner, it is possible to fabricate a wafer which has a planar resistivity dispersion of 1–3%, exhibits a uniform cathode luminescence image, has a surface profile with good flatness following AB etching, and is low in egg-shaped pit density. When FETs were fabricated on a wafer treated according to the invention, their threshold voltages were found to vary within a range of less than 3 mV, which is a high degree of uniformity. It is even more preferable in the foregoing method to include after the completion of the second-stage annealing another step similar to that carried out after the first-stage annealing for removing matter adhering to the wafer surface by etching to a depth of 1 μm or more with an etchant of NaOH solution.

In view of the egg-shaped pit density distribution in the thickness direction shown in FIG. 10, it will be understood that for holding this density to not more than $(1-2) \times 10^4 cm^{-2}$ it is preferable for the amount of processing (etching and/or lapping) given the wafer between the completion of second-stage annealing and product wafer completion to be around 60 μm on each side of the wafer, although the most preferable amount of processing will vary somewhat depending on the annealing time.

The main annealing conditions under which the data indicated in FIGS. 1–15 were obtained were as set out below.

Figure 1:
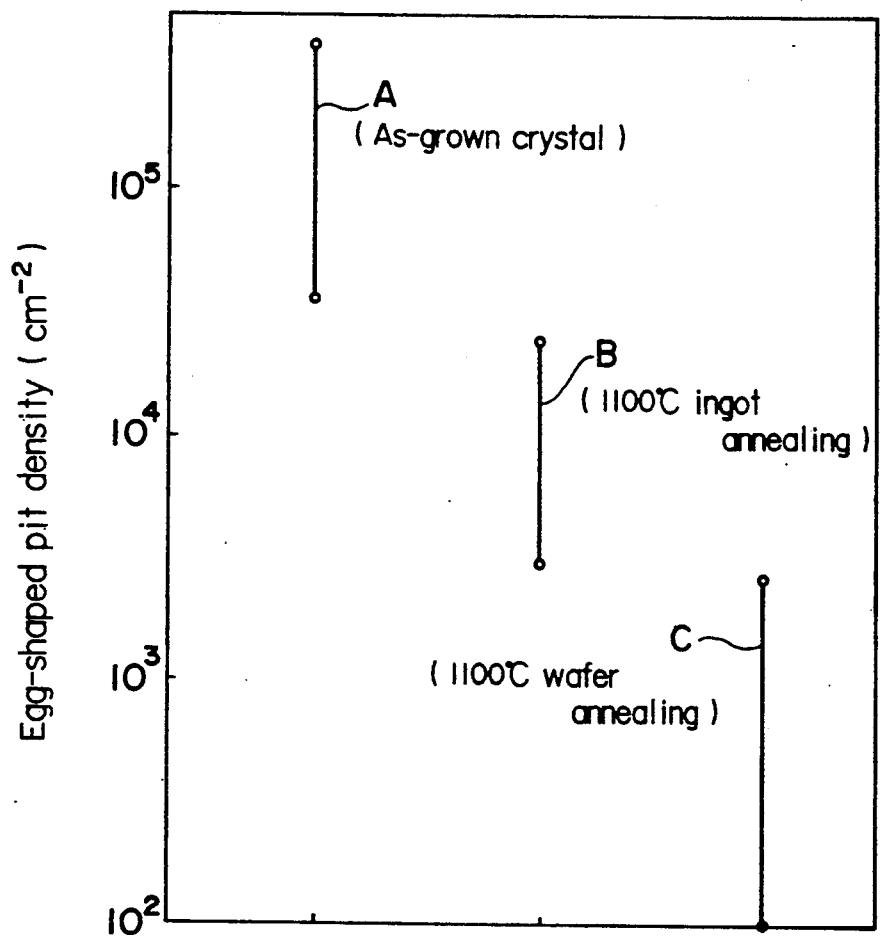
FIG. 1 is a graph showing the range over which the egg-shaped pit density was measured to vary in as-grown crystal, crystal subjected to conventional 1100° C. ingot annealing and crystal subjected to 1100° C. wafer annealing.
Figure 2:
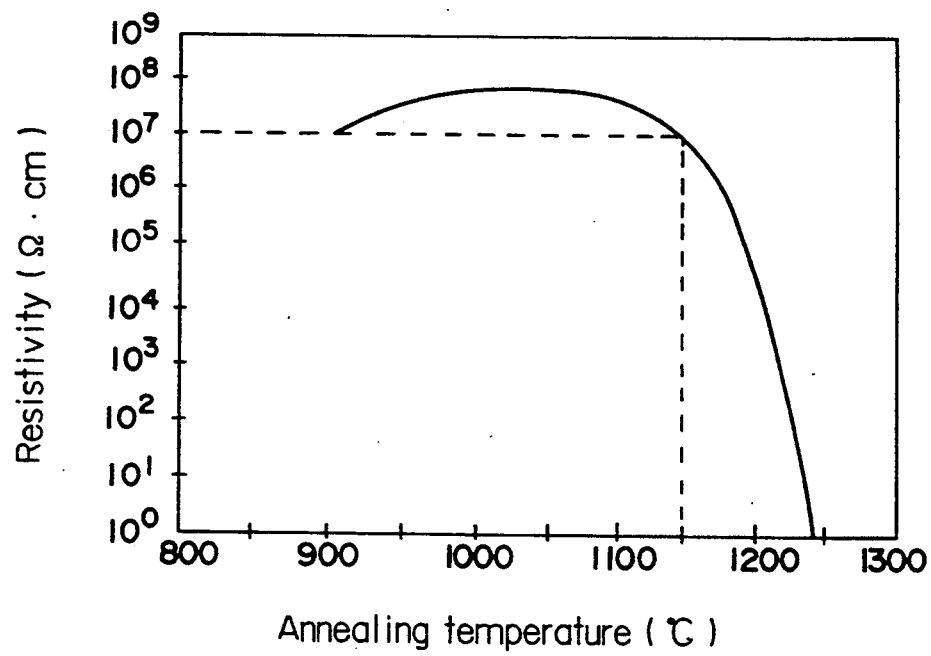
FIG. 2 is a graph showing the correlation between annealing temperature and resistivity in a wafer subjected to conventional high-temperature wafer annealing.

First, in FIG. 1, the conditions of the ingot annealing (other than temperature) were an annealing time of 5 hr, an As vapor pressure of zero and a cooling rate of 20° C./min. The wafer annealing conditions were the same as the ingot annealing conditions except that the As vapor pressure was 1 atm.

Conditions for FIG. 2 other than annealing temperature included an annealing time of 5 hr, an As vapor pressure of 1 atm. and a cooling rate of 20° C./min.

Figure 3:
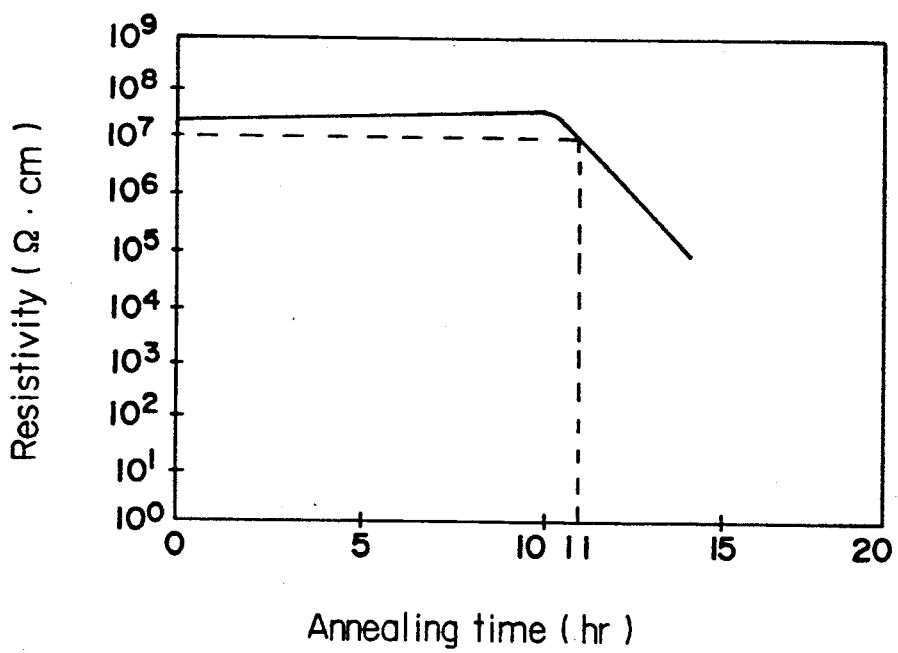
FIG. 3 is a graph showing the correlation between annealing time and resistivity in a wafer subjected to conventional high-temperature wafer annealing.

Conditions for FIG. 3 other than annealing time included an annealing temperature of 1100° C., an As vapor pressure of 1 atm. and a cooling rate of 20° C./min.

Figure 4:
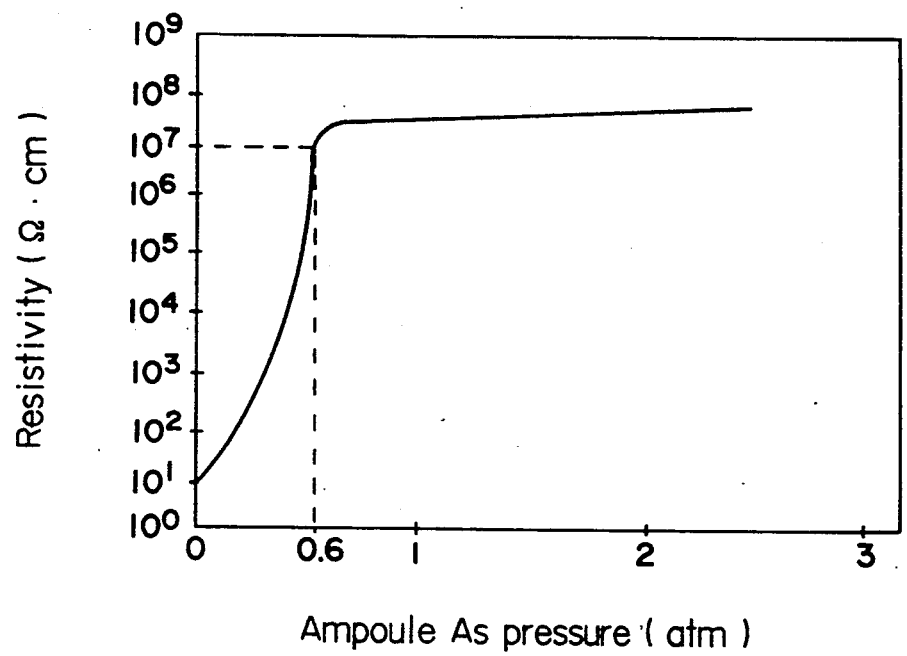
FIG. 4 is a graph showing the correlation between As vapor pressure applied during annealing and resistivity in a wafer subjected to conventional high-temperature wafer annealing.

Conditions for FIG. 4 other than As vapor pressure included an annealing temperature of 1100° C., an annealing time of 2 hr and a cooling rate of 20° C.

Figure 5:
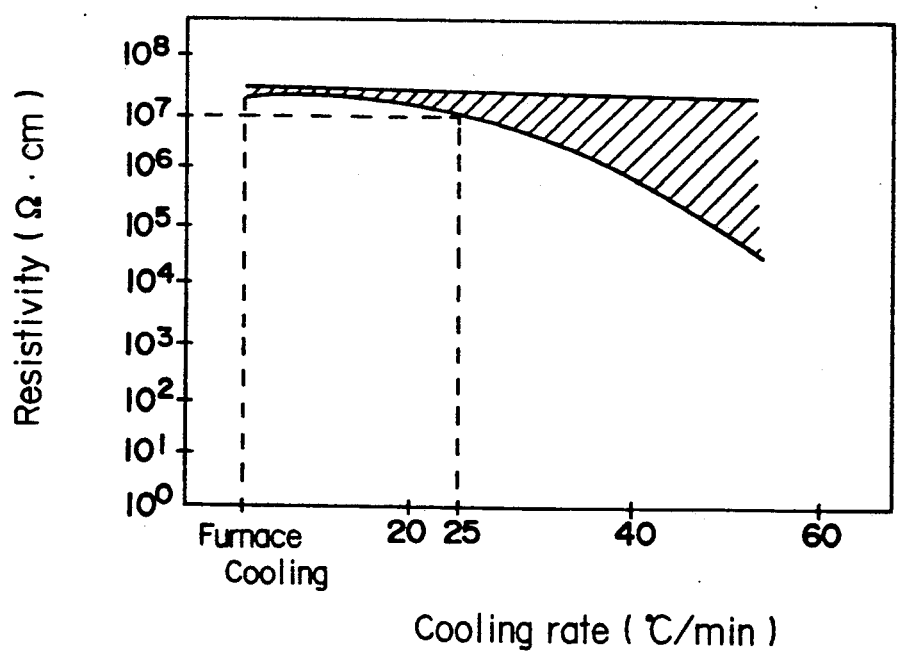
FIG. 5 is a graph showing the correlation between post-annealing cooling rate and resistivity in a wafer subjected to conventional high-temperature wafer annealing.

Conditions for FIG. 5 other than cooling rate included an annealing temperature of 1100° C., an annealing time of 2 hr and an As vapor pressure of 1 atm.

Conditions for FIG. 6 other than annealing temperature included an annealing time of 5 hr, an As vapor pressure of 1 atm. and an cooling rate of 20° C./min.

Figure 7:
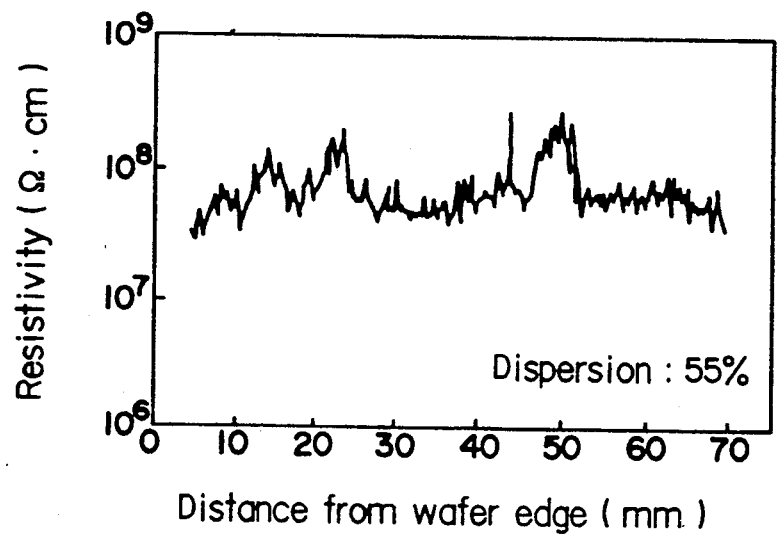
FIG. 7 is a graph showing the post-annealing planar resistivity distribution in a wafer subjected to conventional high-temperature wafer annealing.

The high-temperature annealing conditions for FIG. 7 were an annealing temperature of 1100° C., an annealing time of 5 hr, an As vapor pressure of 1 atm. and a cooling rate of 20° C./min. The two-stage annealing conditions for FIG. 8 were an annealing temperature of 1100° C., an annealing time of 5 hr an As vapor pressure of 1 atm. and a cooling rate of 20° C./min. in the first stage and an annealing temperature of 950° C., an annealing time of 5 hr, and $N_2$ atmosphere and a cooling rate of 20° C./min in the second stage.

The two-stage annealing conditions for FIG. 10 were an annealing temperature of 1100° C., an annealing time of 2 hr, an As vapor pressure of 1 atm. and a cooling rate of 50° C./min. in the first stage and an annealing temperature of 950° C., an $N_2$ atmosphere and a cooling rate of 20° C./min. in the second stage.

The two-stage annealing conditions for FIG. 11 were an annealing temperature of 1100° C., an annealing time of 2 hr, an As vapor pressure of 1 atm. and a cooling rate of 50° C./min. in the first stage and an annealing time of 7 hr., an $N_2$ atmosphere and a cooling rate of 20° C./min. in the second stage.

The three-stage annealing conditions for FIG. 12 were an annealing temperature of 1100° C., an annealing time of 2 hr., an As vapor pressure of 1 atm. and a cooling rate of 5° C./min. in the first stage, an annealing temperature of 950° C., an annealing time of 7 hr, an $N_2$ atmosphere and a cooling rate of 20° C./min. in the second stage and an annealing time of 10 hr and an As vapor pressure of double the dissociation pressure of As at the respective temperatures, and a cooling rate of 20° C./min. in the third stage.

The three-stage annealing conditions for FIG. 13 were an annealing temperature of 1100° C., an annealing time of 2 hr, an As vapor pressure of 1 atm. and a cooling rate of 5° C./min. in the first stage, an annealing temperature of 950° C., an annealing time of 7 hr, and $N_2$ atmosphere and a cooling rate of 20° C./min. in the second stage and an annealing temperature of 600° C., an As vapor pressure of double the dissociation pressure of As at the respective temperatures, and a cooling rate of 20° C./min. in the third stage.

The three-stage annealing conditions for FIG. 14 were an annealing temperature of 1100 C., an annealing time of 2 hr, an As vapor pressure of 1 atm. and a cooling rate of 5° C./min. in the first stage, an annealing temperature of 950° C., an annealing time of 7 hr, an $N_2$ atmosphere and a cooling rate of 20° C./min. in the second stage and an annealing temperature of 600° C., an As vapor pressure of double the dissociation pressure of As at 600° C., and a cooling rate of 20° C./min. in the third stage.

The three-stage annealing conditions for FIG. 14 were an annealing temperature of 1100° C., an annealing time of 2 hr, an As vapor pressure of 1 atm. and a cooling rate of 5° C./min. in the first stage, an annealing temperature of 950° C., an annealing time of 7 hr., an $N_2$ atmosphere and a cooling rate of 20° C./min. in the second stage and an annealing temperature of 600° C., an As vapor pressure of double the dissociation pressure of As at 600° C., and a cooling rate of 20° C./min. in the third stage.

The three-stage annealing conditions for FIG. 15 were an annealing temperature of 1100° C., an annealing time of 2 hr, an As vapor pressure of 1 atm. and a cooling rate of 5° C./min. in the first stage, an annealing temperature of 950° C., an annealing time of 7 hr, an $N_2$ atmosphere and a cooling rate of 20° C./min. in the second stage and an annealing temperature of 600° C., an As vapor pressure of double the dissociation pressure of As at 600° C., and a cooling rate of 20° C./min. in the third stage.

The three-stage annealing conditions for FIG. 15 were an annealing temperature of 1100° C., an annealing time of 2 hr, an As vapor pressure of 1 atm. and a cooling rate of 5° C./min. in the first stage, an annealing temperature of 950° C., an annealing time of 7 hr., an $N_2$ atmosphere and a cooling rate of 20° C./min. in the second stage and an annealing temperature of 600° C., an annealing time of 10 hr, and an As vapor pressure of double the dissociation pressure of As at 600° C.

EXAMPLE

A semi-insulating undoped GaAs crystal grown by the LEC method and measuring 75 mm in diameter and 120 mm in length was machined into a cylinder and sliced into 720 μm-thick wafers. The surfaces of a wafer were removed of impurities by etching to a depth of 5 μm on each side using a NaOH type etchant (25 g NaOH, 100 cc $H_2O_2$, 2000 cc $H_2O$). The wafer then was vacuum-sealed in a quartz ampoule together with a prescribed amount of As for establishing an As vapor pressure of 1 atm. in terms of $As_4$ during GaAs dummy-blocking and annealing. It was next heat-treated at 1100° C. for 2 hr and cooled to room temperature at a cooling rate of 5° C./min. After being removed from the quartz ampoule, the cooled wafer was etched to a depth of 5 μm on both sides using a NaOH type etchant. The thickness of the wafer at this time was 700 μm. The wafer was then placed in a highly air-tight graphite sleeve and annealed in a nitrogen gas atmosphere at 950° C. for 7 hr, whereafter it was cooled to room temperature at a cooling rate of 20° C./min. After being removed from the sleeve, the cooled wafer was etched to a depth of 2 μm using an NaOH type etchant and was vacuum-sealed in the quartz ampoule together with a prescribed amount of As for establishing at the time of annealing an As vapor pressure in terms of $As_4$ equal to double the dissociation pressure. It was then annealed at 600° C. for 10 hr and thereafter cooled to room temperature at a cooling rate of 20° C./min. Each surface of the annealed wafer was lapped to a depth of about 48 μm to obtain a 600 μm-thick wafer.

The so-obtained wafer was examined for the density of egg-shaped pits following AB etching, cathode luminescence image, planar resistivity distribution, flatness of the surface profile following AB etching and dislocation density. Further, FETs were fabricated on the wafer and measured for dispersion in threshold voltage. The results were an egg-shaped pit density of 9500 $cm^{-2}$, a uniform cathode luminescence image, a planar resistivity dispersion of 2.5%, a surface profile flatness after AB etching of 0.01 μm, and a FET threshold voltage dispersion of 3.0 mV. The dislocation density was substantially the same as that of the as-grown crystal. In this connection, the wafer surface profile flatness after AB etching following the first-stage annealing at 1100° C. and that following the second stage annealing were 0.05 μm and 0.1 μm.

Figure 16:
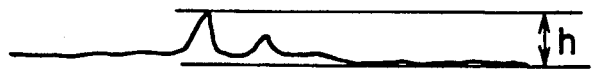
FIG. 16 is an enlarged view of wafer surface irregularities.

The flatness of the wafer surface profile was measured as the wafer surface irregularity height h (see FIG. 16) using an apparatus known as a Talystep. The resistivity was measured by the three-electrode guard ring method.

As explained in the foregoing, this invention provides a method of producing a GaAs single crystal substrate comprising the steps of conducting a first-stage annealing by vacuum-sealing a GaAs single crystal wafer and arsenic in a heat-resistant vessel and heating the wafer to a temperature of 1050° to 1150° C. while exposing it to arsenic vapor pressure, cooling the wafer to room temperature at the rate of 1°-25° C./min., removing the wafer from the vessel, etching the wafer and placing it in another vessel, conducting a second-stage annealing by heating the wafer to a temperature of 910 to 1050° C. in a non-oxidizing atmosphere, cooling the wafer to room temperature at the rate of 1-°25° C./min., removing it from the vessel, etching the wafer, conducting a third-stage annealing by vacuum-sealing the wafer and arsenic in the heat-resistant vessel and heating the wafer to a temperature of 520°-730° C. while exposing it to arsenic vapor, and cooling the wafer at least down to 4009° C. at a rate of 15°-30° C./min., which method is able to provide an excellent GaAs single crystal substrate meeting all five of the following conditions:

(a) uniform cathode luminescence,
(b) low density of the minute defects (egg-shaped pits) which appear when the wafer is AB-etched,
(c) small dispersion in the microscopic resistivity distribution,
(d) flat wafer surface profile after AB etching, and
(e) dislocation density not larger than that of the as-grown crystal, and, as such, enables the so-obtained substrate to be used for high-yield fabrication of FETs exhibiting low threshold value dispersion and outstanding characteristic uniformity.

What is claimed is:

1. A method of producing a GaAs single crystal substrate comprising the steps of conducting a first-stage annealing by vacuum-sealing a GaAs single crystal wafer and arsenic in a heat-resistant vessel and heating the wafer to a temperature of 1050° to 1150° C. while exposing it to arsenic vapor pressure, cooling the wafer to room temperature at a cooling rate of 1°-25° C./min., removing the wafer from the vessel, etching the wafer and placing it in another vessel, conducting a second-stage annealing by heating the wafer to a temperature of 910° to 1050° C. in a non-oxidizing atmosphere, cooling the wafer to room temperature at a cooling rate of 1°-25° C./min., removing it from the vessel, etching the wafer, conducting a third-stage annealing by vacuum-sealing the wafer and arsenic in the heat-resistant vessel and heating the wafer to a temperature of 520°-730° C. while exposing it to arsenic vapor, and cooling the wafer at least down to 400° C. at a cooling rate of 15°-30° C./min.

* * * * *